US 7,638,564 B2

(12) United States Patent
Amou et al.

(10) Patent No.: US 7,638,564 B2
(45) Date of Patent: Dec. 29, 2009

(54) LOW DIELECTRIC LOSS TANGENT-RESIN VARNISH, PREPREG, LAMINATED SHEET, AND PRINTED WIRING BOARD USING THE VARNISH

(75) Inventors: Satoru Amou, Hitachi (JP); Haruo Akahoshi, Hitachi (JP); Yoshihiro Nakamura, Chikusei (JP); Nobuyuki Minami, Chikusei (JP); Yasuhiro Murai, Chikusei (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 248 days.

(21) Appl. No.: 11/529,661

(22) Filed: Sep. 29, 2006

(65) Prior Publication Data

US 2007/0077413 A1 Apr. 5, 2007

(30) Foreign Application Priority Data

Oct. 4, 2005 (JP) ............................. 2005-291211

(51) Int. Cl.
*C08K 5/3447* (2006.01)
*C08K 5/03* (2006.01)
*C08K 3/34* (2006.01)

(52) U.S. Cl. ..................... 524/105; 524/94; 524/469; 524/493

(58) Field of Classification Search ................. 524/94, 524/105, 469, 493
See application file for complete search history.

(56) References Cited

U.S. PATENT DOCUMENTS

| 7,273,900 B2 | 9/2007 | Amou et al. |
| 2005/0064159 A1* | 3/2005 | Amou et al. ............... 428/209 |

FOREIGN PATENT DOCUMENTS

| CN | 1597770 | 3/2005 |
| JP | 05-078552 | 3/1993 |
| JP | 05-156159 | 6/1993 |
| JP | 08-208856 | 8/1996 |
| JP | 09-031275 | 2/1997 |
| JP | 09-118759 | 5/1997 |
| JP | 09-246429 | 9/1997 |
| JP | 10-158337 | 6/1998 |
| JP | 11-21351 | 1/1999 |
| JP | 11-124491 | 5/1999 |
| JP | 2000-043041 | 2/2000 |
| JP | 2000-043042 | 2/2000 |
| JP | 2000-198113 | 7/2000 |
| JP | 2002-249531 | 9/2002 |
| JP | 2003-012710 | 1/2003 |
| JP | 2003-105036 | 4/2003 |
| JP | 2003-160662 | 6/2003 |
| JP | 2003-252983 | 9/2003 |
| JP | 2003-342311 | 12/2003 |
| JP | 2004-087639 | 3/2004 |
| JP | 2005-060635 | 3/2005 |
| JP | 2005-089691 | 4/2005 |
| KR | 1998-042324 | 8/1996 |
| KR | 2005-28779 | 3/2005 |

OTHER PUBLICATIONS

Chinese Office Action with partial translation of Appln. No. 2006101414353 dated May 22, 2009.

* cited by examiner

*Primary Examiner*—Kriellion A Sanders
(74) *Attorney, Agent, or Firm*—Antonelli, Terry, Stout & Kraus, LLP.

(57) ABSTRACT

There is provided a varnish of a low dielectric loss tangent resin composition which is low in viscosity and excellent in storage stability. The varnish of a low dielectric loss tangent resin composition contains a thermosetting monomer (A) having a weight average molecular weight of not more than 1,000, a high polymer (B) having a weight average molecular weight of not less than 5,000, a halogen flame-retardant agent (C), a silicon dioxide filler (D), and an organic solvent (E). The average particle diameter of each the components (C) and (D) is in the range of 0.2 to 3 μm.

7 Claims, 2 Drawing Sheets

LOW DIELECTRIC LOSS TANGENT-RESIN VARNISH, PREPREG, LAMINATED SHEET, AND PRINTED WIRING BOARD USING THE VARNISH

CLAIM OF PRIORITY

The present application claims priority from Japanese application serial No. 2005-291211 filed on Oct. 4, 2005, the content of which is hereby incorporated by reference into this application.

FIELD OF THE INVENTION

The present invention relates to a low dielectric loss tangent resin-varnish for forming an insulating layer with a low dielectric loss tangent in accordance with a high-frequency signal. Furthermore, it relates to a varnish-using wiring board member, such as a prepreg, a laminated sheet, a printed wiring board, or a multilayer printed wiring board.

BACKGROUND OF THE INVENTION

In recent years, the signal band of information communication equipment, such as a PHS or a mobile telephone, and the CPU clock time of a computer have reached the GHz band. The trend toward higher frequencies has been increasingly growing. The transmission loss of an electric signal is represented by the sum of a dielectric loss, a conductor loss, and a radiation loss. The higher the frequency of the electric signal, the more dielectric loss, the conductor loss, and the radiation loss. Since the transmission loss attenuates the electric signal and degrades the reliability of the electric signal, it is necessary to take any measure to suppress increases in dielectric loss, conductor loss, and radiation loss in a wiring board which handles a high-frequency signal. The dielectric loss is directly proportional to the square root of the dielectric constant of an insulator forming a circuit, and to the product of the dielectric loss tangent thereof and the frequency of a signal in use. Accordingly, an increase in dielectric loss can be suppressed by selectively determining an insulating material having a low dielectric constant and a low dielectric loss tangent as the insulator.

Representative materials having low dielectric constants and low dielectric loss tangents will be shown below. A fluorine resin typically represented by polytetrafluoroethylene (PTE) is low in each of dielectric constant and dielectric loss tangent, so that it has been used previously for a substitute material which handles a high-frequency signal. On the other hand, various non-fluorine insulating materials having low dielectric constants and low dielectric loss tangents have also been studied. Because they are readily rendered as varnishes with organic solvents, and they are low in each of molding temperature and curing temperature, and easy to handle. For example, Japanese Patent Laid-Open No. Hei 08-208856 discloses that a diene polymer such as polybutadiene is impregnated into glass cloth and cured with peroxide. Japanese Patent Laid-Open No. Hei 10-158337 discloses an example of annular polyolefin prepared by introducing an epoxy group into a norbornene containing polymer and imparting curability thereto. Japanese Patent Laid-Open No. Hei 11-124491 discloses that acyanate ester, a diene polymer, and an epoxy resin are rendered into the B-stage by heating. Japanese Patent Laid-Open No. Hei 09-118759 discloses an example of a modified resin made of polyphenylene oxide, a diene polymer, and triallyl isocyanate.

Japanese patent Laid-Open No. Hei 09-246429 discloses an example of a resin composition made of allylated polyphenylene ether, triallyl isocyanate, and the like. Japanese Patent Laid-Open No. Hei 05-156159 discloses that polyetherimide and styrene, divinylbenzene, or divinylnaphthalene are alloyed. Japanese Patent Laid-Open No. Hei 05-078552 discloses an example of a resin composition made of, e.g., bis (vinylbenzyl)ether and a novolac phenol resin; the resin composition has been synthesized from a dihydroxy compound and chloromethylstyrene through the Williamson reaction. Japanese Patent Laid-Open No. 2002-249531, Japanese Patent Laid-Open No. 2003-012710, and Japanese Patent Laid-Open No. 2003-105036 disclose that a multifunctional styrene compound having a total hydrocarbon skeleton is used as a crosslinkable component.

Furthermore, prior arts disclose that a filler, a flame-retardant agent, and the like, each having a low dielectric constant and a low dielectric loss tangent is added to the above mentioned insulating materials having low dielectric constants and low dielectric loss tangents, thereby further improving the dielectric properties and imparting a property such flame retardancy thereto. For example, Japanese Patent Laid-Open No. 2003-342311 discloses such an approach which combines 1,2-bis(pentabromophenyl)ethane, 1,2-bis(tetrabromophthalimide)ethane, and a multifunctional styrene compound. Japanese Patent Laid-Open No. 2000-043041, Japanese Patent Laid-Open No. 2000-043042 and Japanese Patent Laid-Open No. 2000-198113 disclose that 1,2-bis (pentabromophenyl)ethane is added to a curable polyphenylene ether resin composition as such an approach. Japanese patent Laid-Open No. Hei 09-031275 discloses that 1,2-bis (pentabromophenyl)ethane is added to polystyrene.

An object of the present invention is to impart stability to a low dielectric loss tangent-resin varnish used in the process of manufacturing a prepreg, for the purpose of improving the productivity of a printed wiring board or multilayer printed wiring board with a low dielectric constant and a low dielectric loss tangent. Prior arts disclose that an insoluble component such as a filler or flame-retardant agent is added to a low dielectric loss tangent resin composition. By the way, when the low dielectric loss tangent resin composition is rendered as a varnish, precipitation of the insoluble component may occur. In prior arts, sufficient measures have not been made against the precipitation of the insoluble component. The present invention intends to cope with such a problem.

Another object of the present invention is to provide a low dielectric loss tangent-resin varnish having excellent storage stability and being capable of providing a cured product exhibiting excellent dielectric properties in a high-frequency range. Furthermore the present invention is to provide a wiring board member using the same, such as a prepreg, a laminated board, a printed wiring board, or a multilayer printed wiring board.

SUMMARY OF THE INVENTION

The present invention includes the following aspects (1) to (11).

(1) A low dielectric loss tangent-resin varnish comprising: a thermosetting monomer (A) having a weight average molecular weight of not more than 1,000; a high polymer (B) having a weight average molecular weight of not less than 5,000; a flame-retardant agent (C) represented by a formula (1) or formula (2) shown below; a silicon dioxide filler (D); and an organic solvent (E), wherein an average particle diameter of each of the components (C) and (D) is in a range of 0.2 to 3.0 μm.

[Chemical Formula 1]

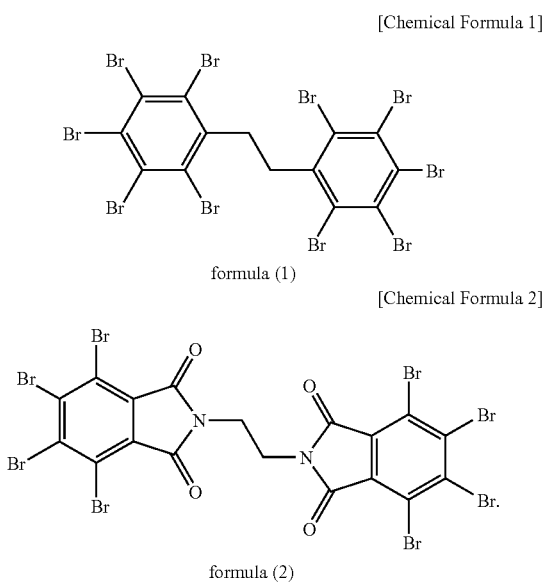

formula (1)

[Chemical Formula 2]

formula (2)

(2) In the low dielectric loss tangent-resin varnish in accordance with the above-mentioned aspect (1), the component (B) is a mixture of a polyphenylene ether resin and an elastomer having a residue of styrene.

(3) In the low dielectric loss tangent-resin varnish in accordance with the aspect (1) or (2), wherein the component (A) is a multifunctional styrene compound represented by a general formula (1) shown below.

[Chemical Formula 3]

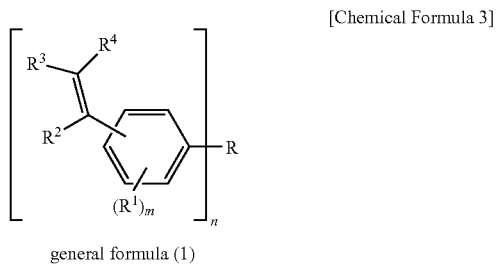

general formula (1)

(wherein R is a hydrocarbon skeleton; $R^1$ is a hydrocarbon group having 1 to 20 carbon atoms, and each may be the same or different;

$R^2$, $R^3$, and $R^4$ are hydrocarbon groups each having 1 to 6 carbon atoms, and each may be the same or different; m is an integer of 1 to 4; and n is an integer of 2 or more).

(4) The low dielectric loss tangent-resin varnish in accordance with the aspect (1) or (2), wherein the component (A) is a bismaleimide compound represented by a general formula (2) shown below.

[Chemical Formula 4]

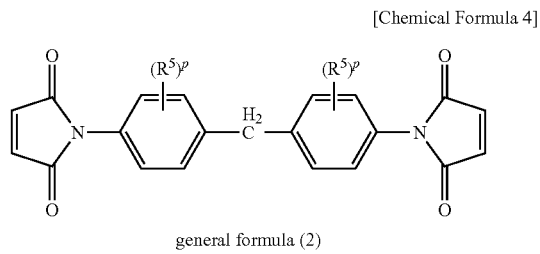

general formula (2)

(wherein $R^5$ is a hydrocarbon radical having 1 to 4 carbon atoms whose number may be the same or different; and p is an integer of 1 to 4).

(5) The low dielectric loss tangent-resin varnish in accordance with the (1) or (2), wherein the component (A) is a mixture of the compound presented by the general formula (1) and the compound presented by the general formula (2).

(6) The low dielectric loss tangent-resin varnish in accordance with any one of the aspects (2) to (5), wherein the component (B) contains a thermosetting polyphenylene ether resin.

(7) A prepreg comprising an organic or inorganic cloth, non-woven fabric or film coated with a low dielectric loss tangent-resin varnish as disclosed in any one of the aspects (1) to (6).

(8) A laminated sheet comprising one or more pieces of prepreg characterized in aspect (7), and a conductor layer provided on one side or both sides of said prepreg, furthermore the laminated sheet is formed by heat-hardening.

(9) The laminated sheet according to aspect (8), wherein the conductor layer is made of conductor foil, a surface of the conductor foil in contact with the hardened prepreg has an average surface roughness of 1 to 3 μm at 10 locations.

(10) A printed wiring board produced by performing a wiring process with respect to the conductor layer of the laminated sheet characterized in aspect (8) or (9).

(11) A multilayer printed wiring board produced by each using the prepreg characterized in aspect (7) and thereby bonding printed wiring boards characterized in aspect (10) in a multilayer structure.

The present invention enables the low dielectric loss tangent-resin varnish to have both excellent storage stability and low viscosity. It also is possible to aid efficient and stable manufacturing of a prepreg for a printed wiring board and a multilayer printed wiring board each having a low dielectric loss tangent. Each of a laminated sheet, a printed wiring board, and a multilayer printed wiring board finally produced from the low dielectric loss tangent-resin varnish has an insulating layer with excellent dielectric properties, so that the varnish according to the present invention is preferable as a wiring material for various electronic equipment using high-frequency signals.

DESCRIPTION OF THE PREFERRED EMBODIMENTS

Figure 1:
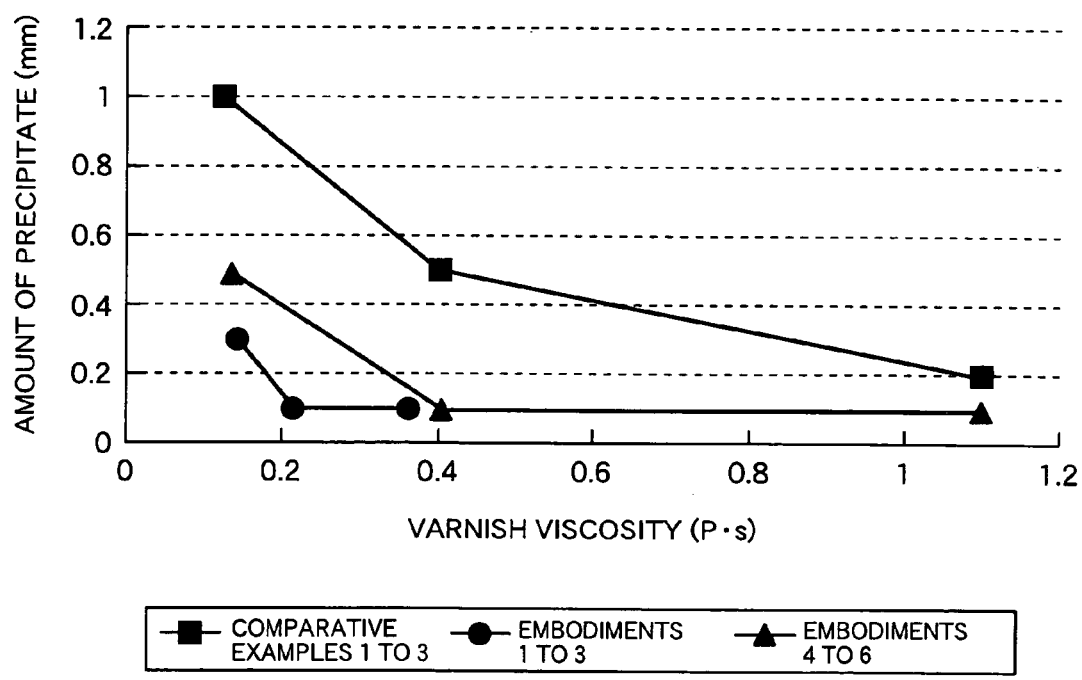
FIG. 1 is a graph showing the relationship between a varnish viscosity and an amount of a deposited precipitate.

One of embodiments of the present invention adds the flame-retardant agent (component (C)) having an average particle diameter of 0.2 to 3.0 μm and a specific structure represented by the formula (1) or formula (2) shown above together with the silicon dioxide filler (component (D)) to the varnish resin composition. Thereby, the dielectric loss tangent of the varnish resin system can be lowered and the storage stability of the varnish can be improved.

It is a known fact that each of the silicon dioxide filler (D) and the flame-retardant agent (C) having the specific structure (hereinafter, this flame-retardant agent (c) having the specific structure is also called as merely "flame-retardant agent (c)") shown above has a low dielectric loss tangent and, by adding the silicon dioxide filler (D) and the frame-retardant agent (C)

to the resin system, the dielectric loss tangent of the entire system can be lowered. Each of the silicon dioxide filler (D) and the flame-retardant agent (C) is insoluble in an organic solvent. Therefore, they are normally used in a state dispersed in a varnish. In this case, when the particle diameters of them are large, their precipitates are likely to be deposited during a coating operation for producing a prepreg or the like. It has been found that, when such precipitates are deposited, the respective contents of the silicon dioxide filler (D) and the frame-retardant agent (C) in the prepreg may be different between immediately after the initiation of the coating operation and after the completion of the coating operation.

A similar phenomenon is also observed during the storage of the varnish. In the varnish after the storage, the silicon dioxide filler (D) and the frame-retardant agent (C) precipitate, resulting a prepreg may be produced with undesirable varnish composition deviated from design specifications. Since the deviation from the design specifications as to the respective contents of the silicon dioxide filler (D) and the flame-retardant agent (C) fluctuate the electric properties and flame retardancy of a printed wiring board or a multilayer printed wiring board as a final product, it should be circumvented. In a varnish having a viscosity of 0.1 to 1 Pa·s suitably for the coating operation, the rapid precipitation of the silicon dioxide filler (D) and the frame-retardant agent (C) can be prevented by adjusting the average particle diameter of each of the two components (namely silicon dioxide filler (D) and frame-retardant agent (C)) to 0.2 to 3.0 μm, though it differs depending on the varnish viscosity. It was proved that, by adjusting the average particle diameter to the foregoing values, an operation time or storage period of 8 to 24 hours was guaranteed. This improved the storage stability of the varnish and allowed stable manufacturing of a printed wiring board and a multilayer printed wiring board each having a low dielectric loss tangent.

As a result of further examination, it was found that, in the varnish containing the silicon dioxide filler (D) and the flame-retardant agent (C) each having particle diameters within the range according to the present invention, the re-dispersibility of the insoluble component by re-stirring was excellent, and the varnish with a precipitate deposited therein could become easily reusable. In terms of reusable varnish, the use of the silicon dioxide filler (D) and the flame-retardant agent (C) within the range according to the present invention was effective. In terms of preventing precipitation, a further reduction in particle diameter is effective, though problems associated with particle diameter control, manufacturing cost, and the like remain to be solved.

Preferably, a surface treatment is performed with respect to the silicon dioxide filler (D) to improve the adhesion thereof to the resin. As an example of a surface treating agent, a silane compound can be listed. Specific examples of the silane compound include dimethylvinylmethoxysilane, methylvinyldimethoxysilane, γ-methacryloxypropyltrimethoxysilane, vinyltrimethoxysilane, vinyltriethoxysilane, p-styryltrimethoxysilane, 3-methacryloxypropylmethyldimethoxysilane, 3-methacryloxypropyltrimethoxysilane, 3-acryloxypropyltrimethoxysilane, methyldiethoxysilane, dimethyldiethoxysilane, trimethyldiethoxysilane, γ-aminopropyltriethoxysilane, N-β-(aminoethyl)-γ-aminopropyltriethoxysilane, N-β-(aminoethyl)-γ-aminopropylmethyldimethoxysilane, γ-glycidoxypropyltrimethoxysilane, and γ-mercaptopropyltrimethoxysilane.

These surface treating agents may be used either alone or in a combination thereof. The effect of the surface treating agent or agents is the modification of the surface of the silicon dioxide filler (D), the enhancement of adhesion to the resin, the prevention of slight delamination at an interface between the filler and the resin, and resulting prevention of the entrance of an impurity into the interface. This allows a further reduction in dielectric loss tangent and also an improvement in a thermal property such as solder heat resistance during absorption of moisture. Since the minute silicon dioxide filler according to the present invention has a large surface area, the effect of the surface treating agent or agents listed above is particularly large. The surface treatment may also be performed by adding the surface treating agent or agents into the resin composition. Alternatively, a silicon dioxide filler to which the surface treatment has been preliminarily performed may also be used instead. The added amount of the surface treating agent or agents is preferably minimized within a range in which the silicon dioxide filler (D) apparently achieves the effect of reducing the dielectric loss tangent because the residuum thereof leads to an increase in dielectric loss tangent. Specifically, the added amount of the surface treating agent or agents is preferably in the range of 0.5 to 2 parts by weight based on 100 parts by weight of the silicon dioxide filler (D) having particle diameters within the range according to the present invention.

For the flame-retardant agent (C) having the specific structure used in the present invention, by contrast, it is unnecessary to use a surface treating agent or agents as used for the silicon dioxide filler (D). That is, since the addition of the surface treating agent or agents which leads to an increase in dielectric loss tangent is unnecessary, the low dielectric loss tangent of the resin system is further reduced by using the flame-retardant agent (C) in conjunction with the silicon dioxide filler (D). The present invention can impart sufficient stability to the low dielectric loss tangent resin-varnish by using the silicon dioxide filler (D) with an average particle diameter of 0.2 to 3 μm in conjunction together with the flame-retardant agent (C). In addition, the present invention allows an effectively reduction in the dielectric loss tangent of the insulating layer of a printed wiring board or a multilayer printed wiring board finally produced from the varnish according to the present invention.

As the thermosetting monomer used in the present invention, a compound with a weight average molecular weight of not more than 1,000 is preferably used. In the present invention, the weight average molecular weight refers to a weight average molecular weight calculated in terms of polystyrene, which is determined by GPC (Gel Permeation Chromatography). By using the thermosetting monomer having a weight average molecular weight within the range calculated in terms of polystyrene, it can be easily combined with various high polymers, oligomers, monomers, and other additives. Of the properties of the resin composition, the melt fluidity during a molding process further increases to enable a molding process at a relatively low temperature. In addition, it becomes possible to easily adjust the fluidity of the resin composition during molding by controlling a compounded amount thereof. Of the properties of a cured product, the crosslinking density can be adjusted over a wide range by controlling the compounding ratio thereof to those of the other components. This allows easy adjustment of the thermal and mechanical properties thereof.

In terms of reducing the dielectric loss tangent, the multifunctional styrene compound having a plurality of styrene groups and a total hydrocarbon skeleton disclosed in Japanese Patent Laid-Open No. 2004-87639, of which the cured product has an extremely low dielectric loss tangent, is particularly preferred as the thermosetting monomer (A). Examples of the multifunctional styrene compound having a total hydrocarbon skeleton include 1,2-bis(p-viphenyl)

ethane, 1,2-bis(m-vinylphenyl)ethane, 1-(p-vinylphenyl)-2-(m-vinylphenyl)ethane, bis(p-vinylphenyl)methane, bis(m-vinylphenyl)methane, p-vinylphenyl-m-vinylphenylmethane, 1,4-bis(p-vinylphenyl)benzene, 1,4-bis(m-vinylphenyl)benzene, 1-(p-vinylphenyl)-4-(m-vinylphenyl)benzene, 1,3-bis(p-vinylphenyl)benzene, 1,3-bis(m-vinylphenyl)benzene, 1-(p-vinylphenyl)-3-(m-vinylphenyl)benzene, 1,6-bis(p-vinylphenyl)hexane, 1,6-bis(m-vinylphenyl)hexane, 1-(p-vinylphenyl)-6-(m-vinylphenyl)hexane, and a divinylbenzene polymer (oligomer) having a vinyl group in a side chain thereof. These compounds are used alone or in a combination of two or more thereof.

When the bismaleimide compound having the specific structure represented by the general formula (2) is used as the thermosetting monomer (A), the viscosity of the varnish thereof can be particularly reduced. In addition, it has been found that the cured product of a resin composition containing the bismaleimide compound having the specific structure shown in the general formula (2) has a characteristic feature of a dielectric loss tangent lower than that of a cured product using any of other bismaleimide compounds, though it is not less than the dielectric loss tangent of the multifunctional styrene compound mentioned above. This may be conceivably because an intermolecular rotational movement is suppressed by the steric hindrance of an alkyl substituent group ($R^5$) introduced in the aromatic ring of the bismaleimide compound according to the present invention and an increase in dielectric loss tangent us thereby suppressed.

Examples of the bismaleimide compound having the specific structure according to the present invention include bis(3-methyl-4-maleimidephenyl)methane, bis(3,5-dimethyl-4-maleimidephenyl)methane, bis(3-ethyl-4-maleimidephenyl)methane, bis(3-ethyl-5-methyl-4-maleimidephenyl)methane, and bis(3-n-butyl-4-maleimidephenyl)methane.

The low dielectric loss tangent-resin varnish of a composition used in the present invention, which contains the bismaleimide compound having the specific structure represented by the general formula (2) as a crosslinking component, has a viscosity as low as about 1/6 of the viscosity of a low dielectric loss tangent varnish containing the multifunctional styrene compound represented by the general formula (1) shown above as a crosslinking component. A high-concentration and low-viscosity varnish is preferred in terms of the efficiency of the coating operation since it allows easy control of film thickness and has an excellent film-forming property. In addition, because the varnish is low in viscosity, a foreign substance in the varnish is easily removed by filtration, so that the varnish is also preferred in terms of the efficiency of a filtering operation. In such a low-viscosity/low dielectric loss tangent-resin varnish, the precipitation of the filler and the flame-retardant agent compounded therein is normally observed, so that a problem associated with the stability of the varnish occurs. However, the present invention uses the minute silicon dioxide filler (D) and flame-retardant agent (C) having the specific structure each having particle diameters of 0.2 to 3 μm and thereby prevents the conspicuous precipitation of them in the varnish. In the present invention, it is also possible to use the multifunctional styrene compound represented by the general formula (1) and the bismaleimide compound represented by the general formula (2) in combination each as the thermosetting monomer (A) and further add a third thermosetting component in accordance with requested properties. This allows the viscosity of the varnish, the dielectric properties of the insulating layer of a printed wiring board or a multilayer printed wiring board, the adhesion thereof to a conductor layer, and the like to be adjusted in accordance with the purpose of an application.

Preferably, the high polymer (B) has a weight average molecular weight of not less than 5,000. By using the high polymer (B) in combination, it is possible to prevent a base material in the prepreg from losing a low-molecular-weight component when it is handled. Since the strength or stretching of the resin composition after curing can be improved, the handling property of a printed wiring board or a multilayer printed wiring board as a final product and the adhesion thereof to conductor foil can be improved.

In the present invention, the type of the high polymer (B) is not basically limited. However, the high polymer (B) preferably has a compatibility with the thermosetting monomer (A) mentioned above in the varnish state in terms of workability.

Examples of the high polymer (B) include a homopolymer or copolymer of butadiene, isoprene, styrene, methylstyrene, ethylstyrene, divinylbenzene, acrylic ester, acrylonitrile, N-phenylmaleimide, or N-(vinylphenyl)maleimide, polyphenyl ether which may have a substituent group, and polyolefin having an alicyclic structure. In particular, a polyphenylene ether resin is particularly preferred in terms of dielectric properties, a mechanical strength, and heat resistance. A system, in which a polyphenylene ether resin and an elastomer having residues of styrene of a total hydrocarbon skeleton are used in combination, is preferred. Because it further lowers the relative dielectric constant and dielectric loss tangent of a cured resin product and effectively improves the adhesion to conductor wiring.

Examples of the polyphenylene ether resin, which are preferably used in combination with the elastomer having residues of styrene and a weight average molecular weight of not less than 5,000, include a typical thermoplastic polyphenylene ether (hereinafter abbreviated as PPE) obtained by polymerizing 2,6-dimethyl phenol through oxidative coupling polymerization. Besides, the examples include maleic-anhydride-modified PPE and allyl-modified PPE each disclosed in Japanese Patent Laid-Open No. Hei 9-246429 and a thermosetting PPE having a relatively low molecular weight disclosed in each of Japanese Patent Laid-Open Nos. 2003-160662, 2003-252983, and 2005-60635. In terms of reducing the dielectric loss tangent, a thermoplastic polymer PPE is preferably used. Examples of the elastomer having residues of styrene include a block copolymer of a styrene derivative such as styrene, methyl styrene or ethyl styrene etc. and a diene compound such as 1,3-butadiene or isoprene etc.; and a hydrogenated product thereof.

An organic solvent (E) used in the present invention preferably allows the thermosetting monomer (A) and the high polymer (B) to be dissolved therein. Examples of the organic solvent (E) include methyl ethyl ketone, methyl isobutyl ketone, cyclohexanone, toluene, xylene, tetrahydrofuran, and chloroform. These solvents may be used also in a combination thereof.

In the present invention, the compounding ratio of each of the components can be adjusted appropriately in accordance with properties required of the low dielectric loss tangent-resin varnish and of a printed wiring board or a multilayer printed wiring board as a final product. In general, however, the individual components are preferably used within the following composition ranges.

Proportioning between the thermosetting monomer (A) and the high polymer (B) is such that the compounding ratio of the thermosetting monomer (A) is arbitrarily selected from within the range of 5 to 95 parts by weight, and the compounding ratio of the high polymer (B) is arbitrarily selected from within the range of 95 to 5 parts by weight. Preferably, the thermosetting monomer (A) is selected from within the range of 50 to 95 parts by weight, and the compounding ratio of the high polymer (B) is selected from within the range of 50 to 5 parts by weight. More preferably, the thermosetting monomer (A) is selected from within the range of 50 to 80 parts by weight, and the compounding ratio of the high polymer (B) is selected from within the range of 50 to 20 parts by weight. Preferably, the solvent resistance, strength, film-forming property, adhesion, and the like of the cured product are adjusted within the composition ranges.

The compounded amount of the flame-retardant agent (C) is in the range of 10 to 150 parts by weight when the total combined amount of the thermosetting monomer (A) and the high polymer (B) is assumed to be 100 parts by weight. The compounded amount of the silicon dioxide filler (D) is preferably adjusted within the range of 10 to 150 parts by weight. The compounded amounts of the two components are preferably adjusted in accordance with required properties, such as flame retardancy, dielectric properties, and thermal expansivity. Preferably, the total combined amount of the flame-retardant agent (C) and the silicon dioxide filler (D) does not exceed 200 parts by weight in terms of formability.

The added amount of the organic solvent (E) differs depending on the types of the solvent, the thermosetting monomer, and the high polymer, but it is preferably adjusted such that the varnish viscosity is in the range of 0.1 to 1Pa·s, preferably 0.1 to 0.5Pa·s, in terms of workability. The precipitation of the flame-retardant agent (C) and the silicon dioxide filler (E) can be suppressed within the viscosity range. It is to be noted that, if the viscosity of the low dielectric loss tangent resin-varnish are increased, the precipitation described above may be further suppressed. However the increased viscosity lowers the efficiency of the filtering operation for removing a foreign substance in the varnish. In addition, since there is a case where a slight evaporation of the solvent causes a new problem such as the solidification of the varnish, the varnish viscosity is preferably adjusted within the viscosity range shown above.

The low dielectric loss tangent resin-varnish of the present invention can be used in the form of a prepreg obtained by coating the varnish on organic or inorganic cloth, non-woven fabric, or a film and drying it. Examples of the inorganic cloth and non-woven fabric include cloth and non-woven fabric made of $SiO_2$ (Q-glass), the $SiO_2$—$Al_2O_3$—$B_2O_3$—$K_2O$—$Na_2O$ system (D-glass), the $SiO_2$—CaO—$Al_2O_3$—$B_2O_3$—MgO—$K_2O$—$Na_2O$—$TiO_2$ system (NE-glass), the $SiO_2$—CaO—$Al_2O_3$—MgO—$K_2O$—$Na_2O$ system (T-glass), and the $SiO_2$—CaO—$Al_2O_3$—$B_2O_3$—MgO—$K_2O$—$Na_2O$ system (E-glass). Examples of the organic cloth, non-woven fabric, and film include cloth, non-woven fabric, and a film made of a liquid crystal polymer, aramid, PTFE, and the like.

The low dielectric loss tangent resin-varnish of the present invention can be used in the form of conductor foil provided with a resin obtained by coating the varnish on conductor foil and drying it (e.g., RCC (Resin Clad Copper) obtained by forming a resin layer on copper foil). The temperature at which the prepreg or RCC is dried differs depending on the type of an organic solvent used for the varnish, the thickness of the resin layer, and the like. For example, when toluene is used as the solvent, the prepreg or RCC is preferably dried at 80 to 130 ° C. for about 30 to 90 minutes.

By laminating conductor foil such as electrolytic copper foil or rolled copper foil on the prepreg of the present invention and then by hot-pressing the prepreg with the conductor foil, it is possible to produce a laminated sheet having a conductor layer on the surface thereof. In a preferred configuration of the conductor foil used in the laminated sheet, the conductor foil preferably has a thickness of 9 to 36 μm in terms of etching processibility and a surface roughness of about 1 to 3 μm in terms of reducing a conductor loss. The conductor foil used in the present invention is allowed to have enhanced adhesion to a resin layer by performing a surface treatment with respect thereto, similarly to the silicon dioxide filler.

For the purpose of convenience of adjusting the curing temperature and storage stability for the low dielectric loss tangent-resin varnish, and for the purpose of convenience of a visual inspection for the varnish, a colorant, a polymerization initiator, a polymerization inhibitor, a UV light absorber, and the like may also be further added. The added amounts of such additive components can be arbitrarily and selectively determined within permissible ranges defined by required properties, such as a property of transmission to a printed wiring board or a multilayer printed wiring board as a final product and heat resistance. Specifically, each of the additives is preferably used within the range of 0.0005 to 10 parts by weight when the total combined amount of the thermosetting monomer (A) and the high polymer (B) is assumed to be 100 parts by weight. More preferably, the total combined amount of the individual additives is not more than 10 parts by weight.

A specific description will be given herein below to the present invention by showing the embodiments and comparative examples thereof. However, the present invention is not limited thereto. Table 1 shows the compositions and varnish viscosities of the embodiments and comparative examples of the present invention. FIG. 1 shows the relationship between the varnish viscosity and the amount of a precipitate measured as an index of the stability of the varnish in each of the embodiments and comparative examples. The names of reagents, a method for synthesis, a method for preparing the varnish, and a method for evaluating the cured product used in the embodiments and comparative examples will be shown herein below.

[Synthesis of Thermosetting Monomer 1:1, 2-bis(vinylphenyl)ethane (BVPE)]

In a 500-ml three neck flask, 5.36 g (220 mmol) of granular magnesium for Grignard reaction (commercially available from Kanto Chemical Co., Ltd.) was placed, and a dropping funnel, a nitrogen inlet tube, and a septum cap were attached to the flask. In a nitrogen stream, the whole system was dehydrated by heating with a drier, while the magnesium granules were being stirred with a stirrer. Then, 300 ml of dried tetrahydrofuran was placed in a syringe and injected into the flask through the septum cap. The resulting solution was cooled to −5° C. and then 30.5 g (200 mmol) of vinylbenzyl chloride (commercially available from Tokyo Kasei Kogyo Co., Ltd.) was added dropwise thereto over about 4 hours by using the dropping funnel. After the completion of the dropwise addition, stirring was continued at 0° C. for 20 hours.

After the completion of the reaction, the reaction solution was filtered to remove residual magnesium and the filtrate was concentrated with an evaporator. The concentrated solution was diluted with hexane, washed once with a 3.6% aqueous hydrochloric acid solution and three times with pure water, and then dehydrated with magnesium sulfate. The dehydrated solution was purified by passage through a short column of silica gel (Wakogel™ C300 commercially available from Wako Pure Chemical Industries, Ltd.)/hexane) and dried in a vacuum to provide the objective BVPE. The BVPE thus obtained was a mixture of 1,2-bis(p-vinylphenyl)ethane (solid p-p form), 1,2-bis(m-vinylphenyl)ethane (liquid m-m form), and 1-(p-vinylphenyl)-2-(m-vinylphenyl)ethane (liquid m-p form) and the yield was 90%.

Examination of its structure by $^1$H-NMR showed that the values thus obtained were in agreement with those reported in the document (6H-vinyl: a-2H, 6.7), β-4H (5.7, 5.2); 8H-aromatic (7.1 to 7.4); 4H-methylene (2.9)). The BVPE obtained was used as the thermosetting monomer 1.

(1) Thermosetting Monomer 2: bis(3-ethyl-5-methyl-4-maleimidephenyl)methane (BMI-5100™ commercially available from Daiwa Kasei Industry Co., Ltd.)

(2) Thermosetting Monomer 3: bis(4-maleimidephenyl)methane (BMI-1000™ commercially available from Daiwa Kasei Industry Co., Ltd.)

(3) High Polymer 1: thermoplastic polymer polyphenylene ether (YPX™100F commercially available from Mitsubishi Gas Chemical Company. Inc.)

(4) High Polymer 2: hydrogenated styrene-butadiene block copolymer (Tuftec™ H1051 commercially available from Asahi Kasei Chemicals Corporation)

(5) Filler: spherical silicon dioxide filler with an average particle diameter of 0.5 μm (commercially available from Admatechs Co., Ltd.)

(6) Flame-Retardant Agent 1: 1,2-bis(pentabromophenyl)ethane with an average particle diameter of 1.5 μm
Flame-Retardant Agent 2: 1,2-bis(tetrabromophthalimide)ethane with an average particle diameter of 2.0 μm
Flame-Retardant Agent 3 (Comparative Agent): 1,2-bis(pentabromophenyl)ethane with an average particle diameter of 5.5 μm (SAYTEXT™ 8010 commercially available from Albemarle Japan Corporation)

(7) Curing Catalyst: 25B; 2.5-dimethyl-2,5-di(t-butylperoxy)hexyne-3 (commercially available from NOF Corporation)

(8) Surface Treating Agent: γ-methacryloxypropyltrimethoxysilane (commercially available from Shin-Etsu Chemical Co., Ltd.)

(9) Glass Cloth: NE-glass cloth with a thickness of 100 μm (commercially available from Nitto Boseki Co., Ltd.)

(10) Copper Foil: surface-treated electrolytic copper foil having a surface average roughness of 2.0 μm on 10 locations and a thickness of 18 μm (commercially available from Nikko Materials Co., Ltd.)

[Method for Preparing Varnish]

A low dielectric loss tangent resin-varnish was produced by dissolving and dispersing prescribed amounts of a thermosetting monomer, a high-polymer component, a filler, a flame-retardant agent, a surface treating agent, and a curing catalyst in a MEK/chloroform solvent mixture or a MEK/toluene solvent mixture.

[Method for Producing Cured Product (Resin Sheet)]

After coating the low dielectric loss tangent-resin varnish on a PET film and drying it, the coated varnish was delaminated, filled in a spacer made of iron and having a thickness of 1.5 mm, and hardened by hot-pressing in a vacuum, thus a hardened resin sheet is produced. The hot-pressing conditions for hardening were such that, after pressing under 2 MPa at a room temperature, the temperature was increased at a constant speed (6° C./minute), then heating is continued at 180° C. for 100 minutes. Thus the hardened resin product (resin sheet) is produced.

[Method for Producing Prepreg]

A prepreg was produced by immersing a glass cloth in the low dielectric loss tangent-resin varnish, vertically raising the glass cloth at a constant speed, and drying it at 80° C. for 30 minutes. The amount of the low dielectric loss tangent resin-composition (varnish) adhered to the glass cloth was about 53 wt %.

[Method for Producing Laminated Sheet]

A laminated sheet was produced by sandwiching the produced prepreg between copper foil placed on the upper and lower surfaces thereof, pressurizing it at 4 MPa at a room temperature, increasing the temperature at a speed of 6° C./minute, and then hardening the prepreg by heating it at 180° C. for 100 minutes.

[Measurement of Relative Dielectric Constant and Dielectric Loss Tangent]

The values of the relative dielectric constant and the dielectric loss tangent at 10 GHz were measured by a cavity resonance method (using 8722ES Network Analyzer commercially available from Agilent Technologies, Inc. and a cavity resonator commercially available from Kanto Electronics Application & Development Inc.). A sample was cut into a size of 1.5×1.5 ×80 mm and used.

[Storage Stability of Low Dielectric Loss Tangent Varnish]

The low dielectric low tangent-resin varnish was placed in a sample tube having a diameter of 18 mm and a height of 40 mm, hermetically sealed, and allowed to stand for 24 hours. Thereafter, the thickness (mm) of a deposited precipitate was measured as an index of storage stability.

[Measurement of Viscosity]

The varnish viscosity at 25° C. was measured by using an E type viscosimeter.

TABLE 1

| | No. | | Comparative Example 1 | Comparative Example 2 | Comparative Example 3 | Embodiment 1 | Embodiment 2 | Embodiment 3 | Embodiment 4 | Embodiment 5 | Embodiment 6 |
|---|---|---|---|---|---|---|---|---|---|---|---|
| Flame-Retardant Agent | 8010 | φ 5.5 μm | | 40 | | | 0 | | | 0 | |
| | | φ 1.5 μm | | 0 | | | 40 | | | 0 | |
| | BT93 | φ 1.8 μm | | 0 | | | 0 | | | 40 | |
| Crosslinking Component | BMI-1000 | | | | | | 80 | | | | |
| Rubber Component | H1051 | | | | | | 40 | | | | |
| Filler | SO25R | φ 0.5 μm | | | | | 75 | | | | |
| Coupling Agent | KBM503 | | | | | | 0.75 | | | | |
| Solvent | | MEK | 37.5 | 37.5 | 37.5 | 37.5 | 75 | 37.5 | 37.5 | 37.5 | 37.5 |
| | | Toluene | 316.2 | 250.7 | 198.3 | 316.2 | 198.3 | 250.7 | 316.2 | 250.7 | 198.3 |
| Properties of Varnish | | Concentration wt % | 40 | 45 | 50 | 40 | 46 | 45 | 40 | 45 | 50 |

TABLE 1-continued

| No. | | Comparative Example 1 | Comparative Example 2 | Comparative Example 3 | Embodiment 1 | Embodiment 2 | Embodiment 3 | Embodiment 4 | Embodiment 5 | Embodiment 6 |
|---|---|---|---|---|---|---|---|---|---|---|
| | Varnish Viscosity Pa·s | 0.12 | 0.4 | 1.1 | 0.14 | 0.21 | 0.36 | 0.13 | 0.4 | 1.1 |
| Amount of Precipitate mm | After 24 hours | 1 | 0.5 | 0.2 | 0.3 | 0.1 | 0.1 | 0.5 | 0.1 | 0.1 |

COMPARATIVE EXAMPLES 1 to 3

The relationship between the viscosity of each of low dielectric loss tangent-resin varnishes each containing a flame-retardant agent with an average particle diameter of 5.5 μm and the amount of a precipitate are shown in Table 1 and FIG. 1. It was recognized that the amount of the deposited precipitate significantly increased as the varnish viscosity lowered. This proved that, when the flame-retardant agent which was large in particle diameter was used, it was difficult to achieve each of a reduction in varnish viscosity aiming at an improvement in workability and the retention of the storage stability of the varnish.

Embodiments 1 to 6

The relationship between the viscosity of each of low dielectric loss tangent-resin varnishes containing flame-retardant agents with average particle diameters of 1.5 μm and 1.8 μm and the amount of a precipitate is shown in Table 1 and FIG. 1. As a result, it was recognized that, by reducing the particle diameters of the flame-retardant agents, an increase in precipitate resulting from a reduction in varnish viscosity could be suppressed. By reducing the particle diameters of the flame-retardant agents, each of a reduction in varnish viscosity and the retention of the storage stability of the varnish was achieved.

Embodiment 7

The properties of a system in which a typical bismaleimide resin (BMI-1000™) was compounded as the thermosetting monomer are shown in Table 2. In the present invention, it was proved that, by using the bismaleimide resin, a flame-retardant agent having a low dielectric loss tangent, a silicon dioxide filler having a low dielectric loss tangent, polyphenylene ether, and a rubber component in combination, the relative dielectric constant and the dielectric loss tangent were reduced to be lower than those of a cured product (having a relative dielectric constant of 3.2 and a dielectric loss tangent of 0.016) obtained by curing bismaleimide alone.

Embodiment 8

The properties of a system in which the bismaleimide compound (BMI-5100™) having the specific structure according to the present invention was compounded as the thermosetting monomer are shown in Table 2. By compounding the bismaleimide having the specific structure according to the present invention, the varnish viscosity was reduced to 1/10 of that of Embodiment 7 and it was recognized that the relative dielectric constant and the dielectric loss tangent were also significantly improved.

Embodiment 9

The properties of a system in which the multifunctional styrene compound (BVPE) according to the present invention was compounded as the thermosetting monomer are shown in Table 2. It was recognized that, although the varnish viscosity was slightly higher than that of Embodiment 8, the varnish according to Embodiment 9 had more excellent dielectric properties.

Embodiment 10

The properties of a system in which the bismaleimide compound (BMI-5100™) having the specific structure and the multifunctional styrene compound (BVPE) each according to the present invention were compounded as the thermosetting monomers are shown in Table 2. Both the varnish viscosity and the dielectric properties had values intermediate between those of Embodiments 8 and 9 and it was proved that the dielectric properties and the varnish viscosity could be adjusted by compounding both of the thermosetting monomers.

TABLE 2

| No. | | Embodiment 7 | Embodiment 8 | Embodiment 9 | Embodiment 10 |
|---|---|---|---|---|---|
| Crosslinking Component | BMI-1000 | 50 | | | |
| | BMI-5100 | | 50 | | 25 |
| | BVPE | | | 50 | 25 |
| High Polymer | Polymer PPE | | | 25 | |
| | H1051 | | | 25 | |
| Frame-Retardant Agent | 8010/ φ 1.5 μm | | 50 | | |
| Filler | SiO₂/ φ 0.5 μm | | 50 | | |
| Coupling Agent | KBM503 | | 0.5 | | |
| Solvent | Chloroform | | 250 | | |
| | MEK | | 50 | | |
| Varnish Concentration | wt % | 40 | 40 | 40 | 40 |
| Varnish Viscosity | Pa·s | 1 | 0.1 | 0.6 | 0.2 |
| ε' of Resin Plate | 10 GHz | 2.9 | 2.7 | 2.6 | 2.6 |
| tan δ of Resin Plate | 10 GHz | 0.008 | 0.004 | 0.0015 | 0.003 |

Embodiment 11

A prepreg was produced by impregnating glass cloth with the low dielectric loss tangent-resin varnish prepared in Embodiment 9. A laminated sheet was produced by sandwiching the prepreg produced in Embodiment 11 between copper foils. After the copper foil was etched, the dielectric properties of a glass/cured-resin-product structure composing the insulating 10 layer of the laminated sheet were evaluated. As a result, the relative dielectric constant and the dielectric loss tangent at 10 GHz were 3.2 and 0.0021, respectively, so that excellent dielectric properties were obtained. This showed that a printed wiring board or a multilayer printed wiring board produced by using the prepreg and the laminated board each having excellent dielectric properties according to the present invention were excellent in high-frequency transmission property.

Embodiment 12

Figure 2A:
FIG. 2 is a flow chart illustrating a process during the production of a multilayer wiring board.
Figure 2B:
Figure 2C:
Figure 2D:
Figure 2E:
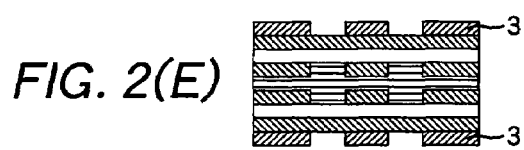
Figure 2F:
Figure 2G:
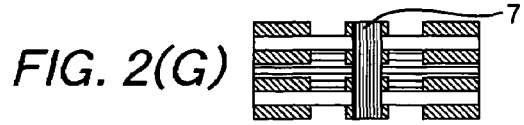
Figure 2H:
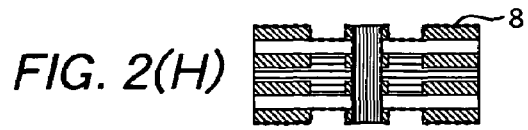
Figure 2I:
Figure 2J:
Figure 2K:
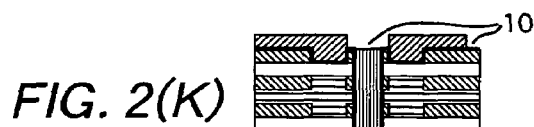
Figure 2L:
Figure 2M:
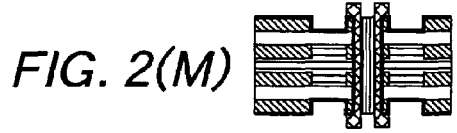
Figure 2N:
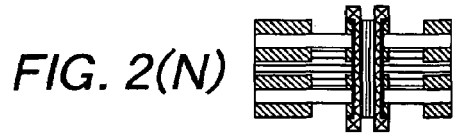

An example of the production of a multilayer printed wiring board according to the present invention will be described herein below with reference to FIGS. 2A to 2N.

(A) A photoresist (HS™ 425 commercially available from Hitachi Chemical Co., Ltd.) was laminated on one side of the laminated sheet obtained in Embodiment 11 and the entire surface thereof is exposed to light. Then, a photoresist (HS™ 425 commercially available from Hitachi Chemical Co., Ltd.) was laminated on the remaining copper surface and a test pattern was transferred thereto by exposure to light. The photoresist on the unexposed portion was developed by using a 1% sodium carbonate solution.

(B) The exposed copper foil was removed by etching using an etchant solution containing a 5% sulfuric acid and a 5% hydrogen peroxide, so that conductor wiring was formed on one side of the laminated sheet.

(C) The remaining photoresist was removed by using a 3% sodium hydroxide solution, so that a printed wiring board having wiring on one side thereof was obtained. Likewise, two printed wiring boards were produced.

(D) The prepreg produced in Embodiment 11 was sandwiched between the respective surfaces of the two printed wiring boards on each of which wiring was formed, and the sandwiched is heated and pressed in a vacuum, thereby providing a multilayer structure. The heating was performed in multiple stages under the heating conditions of 120° C. for 30 minutes, 150° C. for 30 minutes, and 180° C. for 100 minutes and under a pressing pressure of 4 MPa.

(E) A photoresist (HS™ 425 commercially available from Hitachi Chemical Co., Ltd.) was laminated on sheathing copper on the both sides of the produced multilayer board and a test pattern was transferred thereto through exposure to light. Then, the photoresist on the unexposed portion was developed by using a 1% sodium carbonate solution.

(F) The exposed copper foil was removed by etching using an etchant solution containing a 5% sulfuric acid and a 5% hydrogen peroxide. The remaining photoresist was removed by using a 3% sodium hydroxide solution so that outer-layer wiring was formed.

(G) A through hole providing connection between inner-layer wiring and the outer-wiring was formed by drilling.

(H) The multilayer board after perforation was immersed in a colloidal solution of a plating catalyst, so that the catalyst was imparted into the through hole and to the surface of the board.

(I) After the process of activating the plating catalyst, a seed film with a thickness of about 1 μm was provided by electroless plating (using CUST™ 2000 commercially available from Hitachi Chemical Co., Ltd.).

(J) A photoresist (HN™ 920 commercially available from Hitachi Chemical Co., Ltd.) was laminated on each of the both surfaces of the multilayer board.

(K) After the through-hole portion and the end portions of the multilayer board were masked, the multilayer board was exposed to light and developed by using a 3% sodium carbonate solution so that an opening was provided.

(L) Electrodes were disposed on the end portions of the multilayer board and plated copper was formed to a thickness of about 18 μm in the through-hole portion.

(M) The electrode portions were cut away and the remaining photoresist was removed by using a 5% aqueous sodium hydroxide solution.

(N) The wiring board was immersed in an etchant solution containing a 5% sulfuric acid and 5% hydrogen peroxide and etched by a thickness of about 1 μm so that the seed film was removed. As a result, the multilayer printed board was produced. The multilayer printed wiring board thus produced was held in a solder reflow bath at 200° C. for 10 minutes and then held in a solder bath at 288° C. for a 1 minute, with the result that the delamination of a resin interface and wiring or the like did not occur.

What is claimed is:

1. A low dielectric loss tangent-resin varnish comprising:
   a thermosetting monomer (A) having a weight average molecular weight of not more than 1,000,
   a high polymer (B) having a weight average molecular weight of not less than 5,000,
   a flame-retardant agent (C) represented by a formula (1) or formula (2) shown below,
   a silicon dioxide filler (D), and
   an organic solvent (E), wherein
   an average particle diameter of each of the components (C) and (D) is in a range of 0.2 to 3.0 μm and the varnish has a viscosity of 0.1 to 1 Pa·s at 25° C.

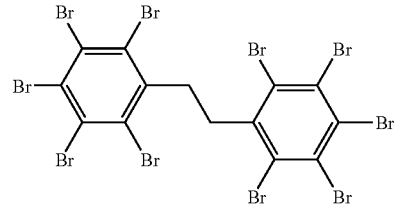

formula (1)

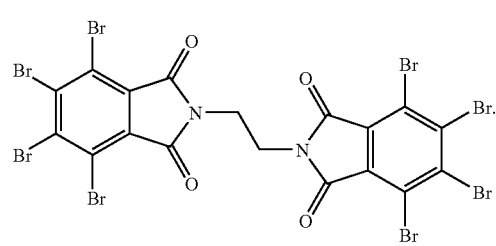

formula (2)

2. The low dielectric loss tangent-resin varnish according to claim 1, wherein said component (B) is a mixture of a polyphenylene ether resin and an elastomer having a residue of styrene.

3. The low dielectric loss tangent-resin varnish according to claim 1, wherein said component (A) is a multifunctional styrene compound represented by a general formula (1) shown below

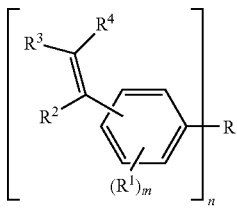

general formula (1)

(wherein R is a hydrocarbon skeleton; $R^1$ is a hydrocarbon radical having 1 to 20 hydrogen or carbon atoms whose number may be the same or different; $R^2$, $R^3$, and $R^4$ are hydrocarbon radicals each having 1 to 6 hydrogen or carbon atoms whose number may be the same or different; m is an integer of 1 to 4; and n is an integer of 2 or more).

4. The low dielectric loss tangent-resin varnish according to claim 1, wherein said component (A) is a bismaleimide compound represented by a general formula (2) shown below

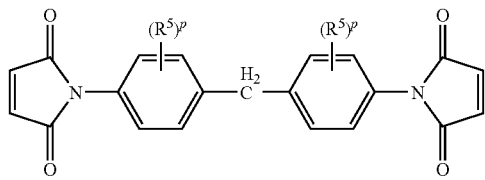

general formula (2)

(wherein R5 is a hydrocarbon radical having 1 to 4 carbon atoms whose number may be the same or different; and p is an integer of 1 to 4).

5. The low dielectric loss tangent-resin varnish according to claim 1, wherein said component (A) is a mixture of a compound represented by the following general formula (1) and a compound represented by the following general formula (2).

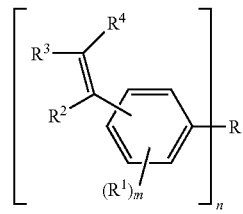

general formula (1)

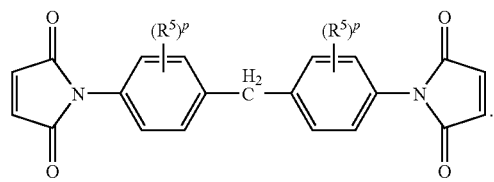

general formula (2)

6. The low dielectric loss tangent-resin varnish according to claim 2, wherein said component (B) contains a thermosetting polyphenylene ether resin.

7. The low dielectric loss tangent-resin varnish according to claim 1, wherein the varnish has a viscosity of 0.1 to 0.5 Pa·s at 25° C.

* * * * *